(12) United States Patent
Liu et al.

(10) Patent No.: US 6,211,040 B1
(45) Date of Patent: Apr. 3, 2001

(54) TWO-STEP, LOW ARGON, HDP CVD OXIDE DEPOSITION PROCESS

(75) Inventors: Huang Liu; John Sudijono; Charles Lin; Quah Ya Lin, all of Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/398,285

(22) Filed: Sep. 20, 1999

(51) Int. Cl.[7] ....................................... H01L 21/76
(52) U.S. Cl. ......................... 438/424; 438/695; 438/787
(58) Field of Search .................................. 438/778, 787, 438/788, 424, 695

(56) References Cited

U.S. PATENT DOCUMENTS

| | | |
|---|---|---|
| 5,494,854 | 2/1996 | Jain . |
| 5,679,606 | 10/1997 | Wang et al. . |
| 5,807,785 | 9/1998 | Ravi ....................................... 438/624 |
| 5,814,564 | 9/1998 | Yao et al. ............................... 438/723 |
| 5,872,058 | 2/1999 | Van Cleemput et al. ............. 438/692 |
| 5,913,140 * | 6/1999 | Roche et al. .......................... 438/624 |
| 5,915,190 * | 6/1999 | Pirkle .................................... 438/424 |

* cited by examiner

Primary Examiner—Tuan H. Nguyen
(74) Attorney, Agent, or Firm—George O. Saile; Rosemary L. S. Pike

(57) ABSTRACT

A method for depositing silicon dioxide between features has been achieved. The method may be applied intermetal dielectrics, interlevel dielectric, or shallow trench isolations. This method prevents dielectric voids, corner clipping, and plasma induced damage in very small feature applications. Features, such as conductive traces, are provided overlying a semiconductor substrate where the spaces between the features form gaps. A silicon dioxide liner layer is deposited overlying the features and lining the gaps, yet leaving the gaps open. The silicon dioxide liner layer depositing step is by high density plasma, chemical vapor deposition (HDP CVD) using a gas mixture comprising silane, oxygen, and argon. The argon gas pressure, chamber pressure, and the sputter rf energy are kept low. A silicon dioxide gap filling layer is deposited overlying the silicon dioxide liner layer to fill the gaps, and the integrated circuit device is completed. The silicon dioxide gap filling layer depositing step is by high density plasma, chemical vapor deposition (HDP CVD) using a gas mixture comprising silane, oxygen, and argon. The argon gas pressure and chamber pressure are kept low while the sputter rf energy is increased.

20 Claims, 2 Drawing Sheets

TWO-STEP, LOW ARGON, HDP CVD OXIDE DEPOSITION PROCESS

BACKGROUND OF THE INVENTION (1) Field of the Invention

The invention relates to a method of fabricating silicon structures, and more particularly, to a process for depositing silicon dioxide between features in the manufacture of integrated circuit devices.

(2) Description of the Prior Art

As device feature size and gate oxide thickness are further scaled down, it becomes more difficult to form interlayer dielectrics. One of the techniques used to form an isolation oxide layer in integrated circuits with very narrowly spaced features, such as metal lines, is through the use of high density plasma, chemical vapor deposition (HDP CVD) processing.

In HDP CVD, a traditional CVD process for depositing silicon dioxide is combined with a simultaneous sputtering process. As the silicon dioxide layer is deposited, it is also sputtered, or etched by the high-density plasma. By combining both a deposition and an etching action in the same process, a very dense and high quality silicon dioxide layer may be formed. In addition, since the etching component can be anisotropically controlled, that is, can etch in specific directions, the HDP CVD offers a significant advantage for deposition of silicon dioxide inside gaps or trenches. The etching component can reduce the deposition rate on vertical sidewalls such that the gap can be filled from the bottom up without the top of the gap closing or pinching off. This prevents the formation of voids or keyholes in the silicon dioxide layer.

Referring now to FIG. 1, an insulating layer 14 is shown formed overlying a semiconductor substrate 10. A pair of metal traces 18 overlies the insulating layer 14. In this situation, it is desirable to form an oxide layer overlying the metal traces 18 and insulating the gap between metal traces 18. In addition, the space between the metal traces is very narrow, at between about 0.2 microns and 0.3 microns. The height of the metal traces is between about 0.55 microns and 1.0 microns such that the aspect ratio of the gap is about 3.

A HDP CVD process is used as typical in the art to form the silicon dioxide layer 22. The HDP CVD process would typically use a gas mixture of silane ($SiH_4$), oxygen, and argon. The silane and oxygen components provide the source species for the deposition of the silicon dioxide. The argon gas is ionized to form the high-density plasma to etch the silicon dioxide layer 22 as this layer is deposited.

As the silicon dioxide layer 22 is deposited, the sputtering reaction also removes some of the material. As shown, the greatest sputter rate is at the corner of the gap. Here, the silicon dioxide layer 22 overlaps the contour of the metal trace 18. The combined deposition and etching reaction creates the angled profile 26 of approximately 45 degrees. This angled profile 26 aids the deposition process by preventing the silicon dioxide layer 22 from closing or pinching off before the gap has been filled completely from below.

The etching rate of the reaction is directly controlled by the partial pressure of the argon gas component of the gas mixture and by the high frequency radio frequency (HFRF) sputter energy. The argon gas is typically flowed at a rate of between about 350 sccm and 400 sccm and constitutes approximately between about 64% and 67% of the gas pressure in the reaction. The HFRF energy is typically in the range of between about 2,500 watts and 3,000 watts. By carefully setting the deposition rate via the silane and oxygen gas flows and the etching rate via the argon gas flow and HFRF energy, an optimal etch to deposition ratio can be established to guarantee gap fills.

This process approach has its limitations, however. If the etching component of the reaction is too low, the silicon dioxide layer 22 pinches off the gap before it has completely filled from the bottom. As a consequence, a keyhole, or void, 30 has formed. This void causes serious reliability problems because of the potential for trapped contamination.

Referring now to FIG. 2, a second possible problem is shown. Here, the etching component is too high. As a consequence, corner clipping 34 occurs. In corner clipping, the plasma etches into the metal traces 18. This problem also represents a potential reliability issue.

As the aspect ratio of the gaps becomes larger, it is not possible to select a single operating point for the HDP CVD process that will both eliminate the corner clipping 34 and prevent the formation of voids 30. In addition, the use of argon plasma poses the additional risk of plasma induced damage (PID) to underlying gate oxide layers. PID occurs because of charging of the semiconductor wafer that occurs due to the plasma. If this charge is sufficiently large, very thin gate oxides can be damaged due to electrical overstress.

Several prior art approaches disclose methods to form silicon dioxide layers, and specifically, to fill gaps between features in the fabrication of integrated circuits. U.S. Pat. No. 5,872,058 to Van Cleemput et al discloses a process to fill gaps with oxide using HDP and CVD. A gas mixture comprising silicon containing, oxygen containing and inert gases is used. The inert gas component of this mixture comprises not more than 13% of the total gas mixture. An electron cyclotron resonance (ECR) process is used with high microwave power for gas dissociation to form the plasma. A single RF frequency is used to drive the argon ion bombardment. Argon is eliminated during the formation of the protective layer. Multiple steps of PE-CVD and HDP are used. U.S. Pat. No. 5,814,564 to Yao et al teaches a process to gap fill with oxide and then to planarize with a spin-on glass layer. A six step etch back process is used in the final planarization. U.S. Pat. No. 5,807,785 to Ravi discloses a process for silicon dioxide gap fill where a plasma enhanced CVD process using TEOS forms a first barrier layer overlying metal traces. A subatmospheric CVD (SACVD) process using TEOS forms the gap filling layer. U.S. Pat. No. 5,679,606 to Wang et al teaches a process to fabricate gap fills of oxide using two steps. In the first step, a protective layer is deposited by HDP CVD without any argon gas flow or sputter rf energy. In the second step, the gap fill layer is deposited using HDP CVD with argon and sputter rf energy. U.S. Pat. No. 5,494,854 to Jain discloses a process for gap filling and planarization. First, a seed layer is deposited using HDP with no sputter rf power. Second, a gap filling layer of approximately equal thickness is deposited using HDP with sputter rf power. A polishing layer and planarization step complete the process.

SUMMARY OF THE INVENTION

A principal object of the present invention is to provide an effective and very manufacturable method of depositing silicon dioxide between features in the manufacture of integrated circuits.

A further object of the present invention is to provide a method to deposit silicon dioxide between features using a two-step, low argon pressure, high-density plasma, chemical vapor deposition process that prevents the formation of voids.

A yet further object of the present invention is to use a two-step, low argon pressure, high-density plasma, chemical vapor deposition process that prevents corner clipping or etching of features.

In accordance with the objects of this invention, a new method of depositing silicon dioxide between features has been achieved. Features, such as conductive traces, are provided overlying a semiconductor substrate where the spaces between the features form gaps. A silicon dioxide liner layer is deposited overlying the features and lining the gaps, yet leaving the gaps open. The step of depositing the silicon dioxide liner layer is by high density plasma, chemical vapor deposition (HDP CVD) using a gas mixture comprising silane, oxygen, and argon. The argon gas pressure, chamber pressure, and the sputter rf energy are kept low. A silicon dioxide gap filling layer is deposited overlying the silicon dioxide liner layer to fill the gaps, and the integrated circuit device is completed. The step of depositing the silicon dioxide gap filling layer is by high density plasma, chemical vapor deposition (HDP CVD) using a gas mixture comprising silane, oxygen, and argon. The argon gas pressure and chamber pressure are kept low while the sputter rf energy is increased.

BRIEF DESCRIPTION OF THE DRAWINGS

In the accompanying drawings forming a material part of this description, there is shown.

DESCRIPTION OF THE PREFERRED EMBODIMENTS

This embodiment discloses the application of the present invention to the deposition of a silicon dioxide layer overlying and filling gaps between metal traces. The present invention can easily be applied to the deposition of a silicon dioxide layer overlying and filling gaps between polysilicon traces as well. In addition, the same technique could be used to fill shallow trench isolations. It should be clear to those experienced in the art that the present invention can be applied and extended without deviating from the scope of the present invention.

Figure 1:
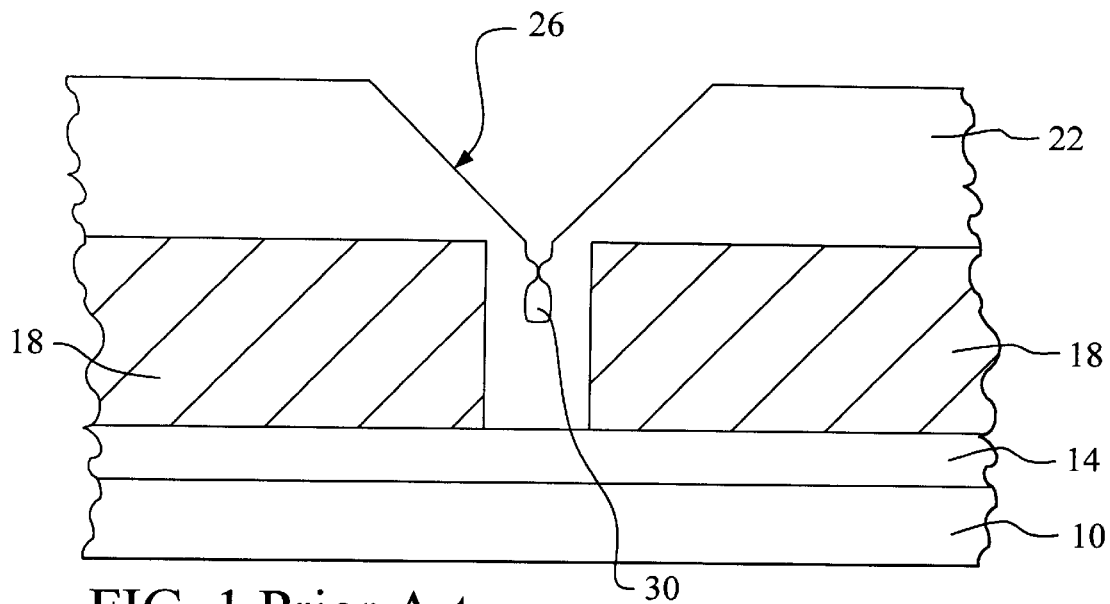
FIGS. 1 and 2 schematically illustrate in cross-section a partially completed prior art integrated circuit device.
Figure 2:
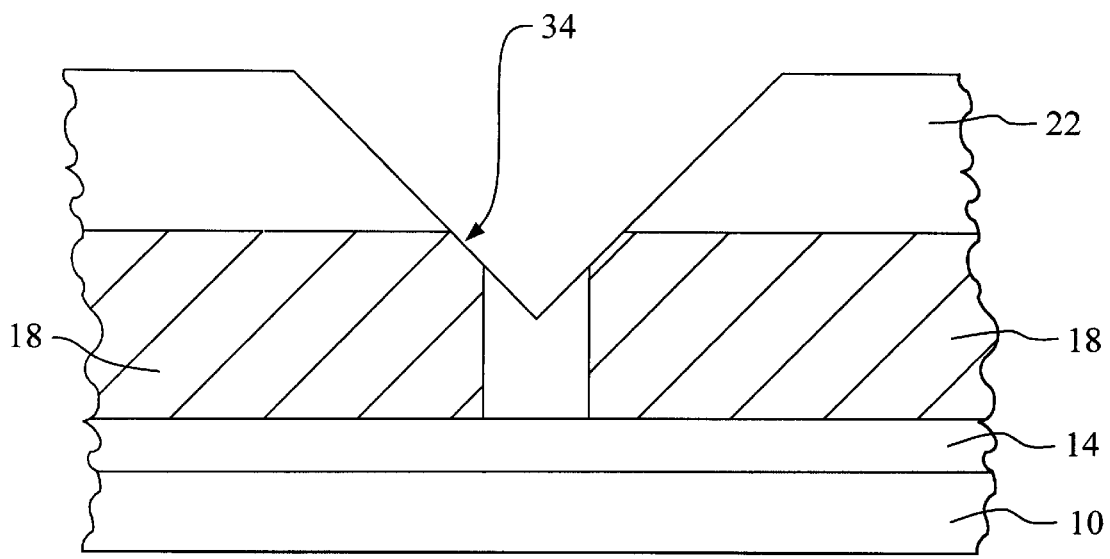
Figure 3:
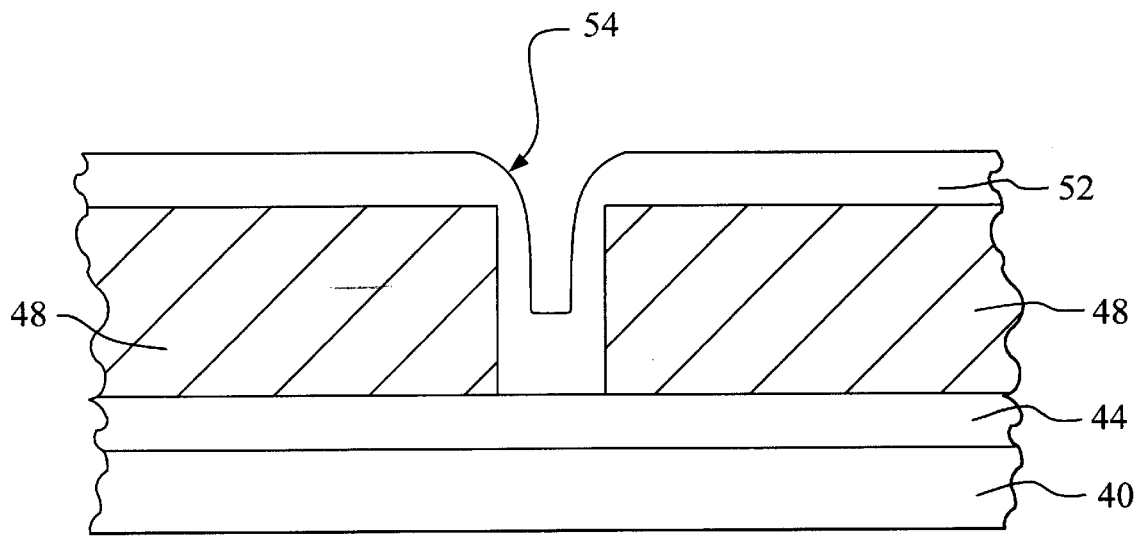
FIGS. 3 through 4 schematically illustrate in cross-sectional representation a preferred embodiment of the present invention.

Referring now more particularly to FIG. 3, there is illustrated, in a cross section, a partially completed integrated circuit device. A semiconductor substrate 40 is preferably composed of monocrystalline silicon. An isolation layer 44 is shown formed overlying the semiconductor substrate 40. The purpose of the isolation layer 44 is to isolate the metal traces 48 from the semiconductor substrate 40. The metal traces 48 may be formed in any conventional method. Typically, the metal traces would be formed by depositing an aluminum alloy layer overlying the isolation layer 44. The metal traces 48 would then be patterned, typically using a photoresist mask to protect the desired pattern during etching.

In this example, as in the prior art, the space between the metal traces is very narrow, at between about 0.2 microns and 0.3 microns. The height of the metal traces is between about 0.55 microns and 1.0 microns. The aspect ratio of the gap is about 3. It is difficult, therefore, to deposit a silicon dioxide layer overlying the metal traces 48 to fill the gap without creating voids in the silicon dioxide or clipping the corners of the metal traces 48.

At this point, an important feature of the present invention is described. As a first step in forming the insulating oxide, a silicon dioxide liner layer 52 is deposited overlying the metal traces 48 and lining the gap between the metal traces 48. The silicon dioxide liner layer is deposited using a HDP, CVD process. The process uses a gas mixture of silane, oxygen, and argon. The preferred gas mixture is comprised of silane flowing at of between about 60 sccm and 100 sccm, oxygen flowing at between about 90 sccm and 150 sccm, and argon flowing at between about 40 sccm and 80 sccm. The argon gas constitutes between about 14% and 35% of the total pressure of the chamber. Note that the argon gas flow is dramatically lower than that of the prior art process.

The reduced argon flow results in a very low-pressure environment for the plasma. The pressure is preferably less than about 2 milliTorr. This low plasma pressure reduces the silicon oxide deposition rate on the sidewalls of the gaps. Because the deposition rate is reduced, the sputtering or etching rate must also be reduced. Therefore, the high frequency radio frequency (HFRF) power is reduced during the deposition of the silicon dioxide liner layer 52. The HFRF power, also called the sputter rf power, establishes the energy of the argon ion plasma that sputters or etches the silicon dioxide layer concurrent with the deposition of this layer. During the deposition of the silicon dioxide liner layer 52, the HFRF is set at between about 1600 watts and about 2200 watts. The low frequency radio frequency (LFRF) power, which is called the plasma rf power and controls the silane and oxygen plasma, is maintained at between about 3500 watts and about 4500 watts.

The relationship between the concurrent silicon dioxide deposition and etching that occurs in the HDP CVD process can be expressed as an etch to deposition ratio, or E/D. E/D is defined by the equation:

$$E/D = (UBUC - BC)/UBUC$$

where UBUC is the deposition rate of the process with no wafer bias or clamping, and BC is the deposition rate of the process with wafer bias and/or clamping. The deposition rate is generally controlled by the silane and oxygen components of the plasma while the etching rate is generally determined by the argon component. For the preferred embodiment of the present invention, the E/D for the deposition of the silicon dioxide liner layer 52 is maintained at between about 0.12 and about 0.15.

The process for forming the silicon dioxide liner layer 52 has two significant advantages over the prior art. First, the combination of lowered deposition and sputtering rates allows the formation of a high quality, dense, silicon dioxide liner layer 52 overlying the metal traces 48 and lining the gaps without closing the gap spaces. An adequate amount of sputter etching also occurs to effectively round the gap corners 54 without over etching into the metal traces 48. Both voids and corner clipping are therefore avoided. This process deposits the silicon dioxide liner layer 52 to a thickness of between about 500 Angstroms and about 8000 Angstroms. The presence of the silicon dioxide liner layer 52 will prevent damage to the metal traces 48, such as corner clipping, during the deposition of the gap filling layer. This is important since the etch rate during the gap filling process is higher than that of the liner layer process.

The second advantage of the present invention technique is the reduction of plasma induced damage (PID). Lowering the chamber pressure lowers the density of the argon ion plasma. This lowered density in turn reduces the amount of wafer charging and electrical stressing. By reducing electrical stressing, this technique has been shown to reduce PID to thin oxides and to improve both yield and reliability.

Figure 4:
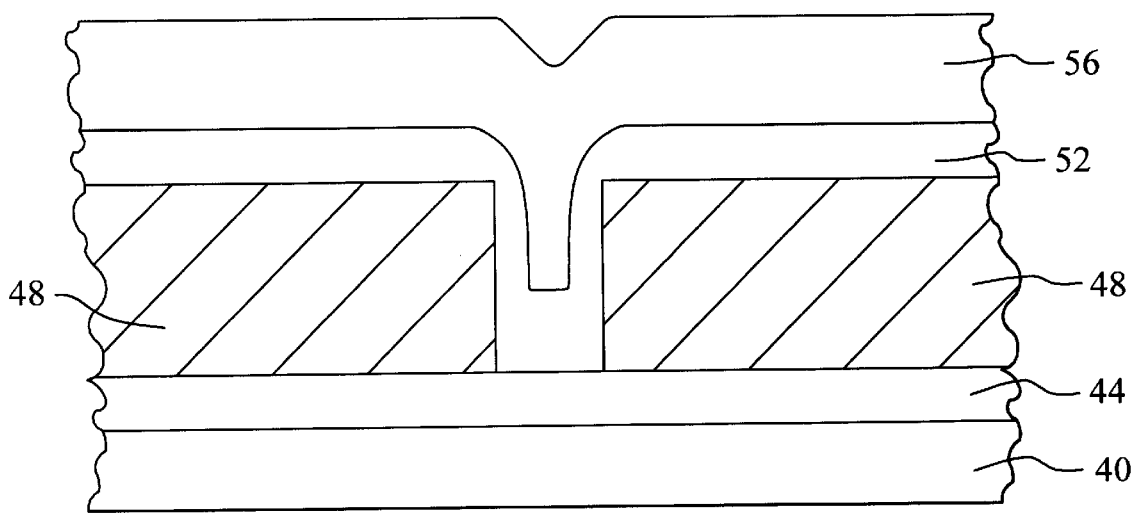

Referring now to FIG. 4, the second major step in forming the insulation oxide is the deposition of the silicon dioxide gap filling layer 56 overlying the silicon dioxide liner layer 52. The silicon dioxide gap filling layer 56 is also deposited using a HDP, CVD process. The process uses a gas mixture of silane, oxygen, and argon. The preferred gas mixture is comprised of silane flowing at between about 60 sccm and 100 sccm, oxygen flowing at between about 90 sccm and 150 sccm, and argon flowing at between about 40 sccm and 80 sccm. The argon gas constitutes between about 14% and 35% of the total pressure of the chamber.

As in the deposition of the silicon dioxide liner layer 52, the argon gas flow is dramatically lower than that of the prior art process. The reduced argon flow results in a very low-pressure environment for the plasma of less than about 2 milliTorr. By maintaining a low plasma chamber pressure, the deposition process for the silicon dioxide gap filling layer 56 can be performed without causing damage to gate oxides due to electrical overstress.

The high frequency radio frequency (HFRF) power is increased during the deposition of the silicon dioxide gap filling layer 56. By increasing the HFRF power, a higher sputter etching rate is established. By increasing the etching rate, the E/D ratio is increased to between about 0.15 and about 0.25. This increased E/D ratio improves the ability of the deposition process to fill the gap completely without creating a void or keyhole. The presence of the previously deposited silicon dioxide liner layer 52 prevents any corner clipping problems during the silicon dioxide gap filling layer 56 deposition. The silicon dioxide gap filling layer 56 is thus deposited to a thickness of between about 500 Angstroms and about 8,000 Angstroms.

During the deposition of the silicon dioxide gap filling layer 56, the HERE is set at between about 2200 watts and about 2800 watts. The low frequency radio frequency (LERE) power is maintained at between about 3500 watts and about 4500 watts.

Following the deposition of the silicon dioxide gap filling layer 56, the integrated circuit may be completed as typical in the art.

The novel approach of the present invention can easily be modified to form doped silicon dioxide layers for the liner layer or the gap filling layer. By adding suitable dopants, such as fluorine, boron, phosphorous, boron, or arsenic, to the HDP CVD gas mixture, doped silicon dioxide layers can be deposited for either the liner layer, the gap filling layer or both. In addition, by making moderate changes to the silane to oxygen ratio or to the HFRF power, the process of the present invention can be optimized for use in other gap filling process. This novel two-step process could then be applied to the formation of intermetal dielectrics (IMD), interlevel dielectrics (ILD), and shallow trench isolations (STI).

As shown in the preferred embodiment, the present invention provides a very manufacturable process for depositing silicon dioxide between features in the manufacture of integrated circuit devices. The unique two step process makes possible the deposition of silicon dioxide dielectric layers between even very closely spaced features while preventing the adverse effects of void formation, corner clipping, and plasma induced damage.

While the invention has been particularly shown and described with reference to the preferred embodiments thereof, it will be understood by those skilled in the art that various changes in form and details may be made without departing from the spirit and scope of the invention.

What is claimed is:

1. A method to fill gaps with silicon dioxide in the manufacture of an integrated circuit device comprising:

providing a semiconductor substrate;

providing features overlying said semiconductor substrate wherein spaces between said features are termed gaps;

depositing a silicon dioxide liner layer overlying said features and lining said gaps while leaving said gaps open, wherein said depositing is by HDP CVD using a gas mixture comprising silane, oxygen, and argon, wherein said depositing is at a chamber pressure of less than 2 milliTorr, and wherein a first sputter rf energy is applied;

depositing a silicon dioxide gap filling layer overlying said silicon dioxide liner layer and filling said gaps, wherein said depositing is by HDP CVD using a gas mixture comprising silane, oxygen, and argon, wherein said depositing is at a chamber pressure of less than 2 milliTorr, and wherein a second sputter rf energy higher than said first sputter rf energy is applied; and completing said integrated circuit device.

2. The method according to claim 1 wherein said step of depositing said silicon dioxide liner layer comprises an etch to deposition ratio of between about 0.12 and about 0.15.

3. The method according to claim 1 wherein said gas mixture used to deposit said silicon dioxide liner layer comprises silane flowing at between about 60 sccm and 100 sccm, oxygen flowing at between about 90 sccm and 150 sccm, and argon flowing at between about 40 sccm and 80 sccm.

4. The method according to claim 1 wherein said step of depositing said silicon dioxide liner layer uses said first sputter rf energy of between about 1600 watts and about 2200 watts.

5. The method according to claim 1 wherein said step of depositing said silicon dioxide liner layer is performed at an argon partial pressure of between about 14% and 35%.

6. The method according to claim 1 wherein said step of depositing said silicon dioxide gap filling layer comprises an etch to deposition ratio of between about 0.15 and about 0.25.

7. The method according to claim 1 wherein said gas mixture used to deposit said silicon dioxide gap filling layer comprises silane flowing at between about 60 sccm and 100 sccm, oxygen flowing at between about 90 sccm and 150 sccm, and argon flowing at between about 40 sccm and 80 sccm.

8. The method according to claim 1 wherein said step of depositing said silicon dioxide gap filling layer uses said second sputter rf energy of between about 2200 watts and about 2800 watts.

9. The method according to claim 1 wherein said step of depositing said silicon dioxide gap filling layer further comprises adding a dopant gas to said gas mixture wherein said dopant gas is a source of one of the group of:

fluorine, boron, phosphorous, boron, and arsenic.

10. The method according to claim 1 wherein said step of depositing said silicon dioxide gap filling layer is performed at an argon partial pressure of between about 14% and 35%.

11. A method to fill gaps with silicon dioxide in the manufacture of an integrated circuit device comprising:

providing a semiconductor substrate;

providing features overlying said semiconductor substrate wherein spaces between said features are termed gaps;

depositing a silicon dioxide liner layer overlying said features and lining said gaps while leaving said gaps open, wherein said depositing is by HDP CVD using a gas mixture comprising silane, oxygen, and argon, wherein said depositing is at a chamber pressure of less than 2 milliTorr, wherein said depositing comprises an etch to deposition ratio of between about 0.12 and about 0.15, and wherein a first sputter rf energy is applied;

depositing a silicon dioxide gap filling layer overlying said silicon dioxide liner layer and filling said gaps, wherein said depositing is by HDP CVD using a gas mixture comprising silane, oxygen, and argon, wherein said depositing is at a chamber pressure of less than 2 milliTorr, wherein said depositing comprises an etch to deposition ratio of between about 0.15 and about 0.25, and wherein a second sputter rf energy higher than said first rf energy is applied; and completing said integrated circuit device.

12. The method according to claim 11 wherein said step of depositing said silicon dioxide liner layer uses said first sputter rf energy of between about 1600 watts and about 2200 watts.

13. The method according to claim 11 wherein said step of depositing said silicon dioxide liner layer is performed at an argon partial pressure of between about 14% and 35%.

14. The method according to claim 11 wherein said step of depositing said silicon dioxide gap filling layer uses said second sputter rf energy of between about 2200 watts and about 2800 watts.

15. The method according to claim 11 wherein said step of depositing said silicon dioxide gap filling layer further comprises adding a dopant gas to said gas mixture wherein said dopant gas is a source of one of the group of:

fluorine, boron, phosphorous, boron, and arsenic.

16. The method according to claim 11 wherein said step of depositing said silicon dioxide gap filling layer is performed at an argon partial pressure of between about 14% and 35%.

17. A method to fill gaps with silicon dioxide in the manufacture of an integrated circuit device comprising:

providing a semiconductor substrate;

providing features overlying said semiconductor substrate wherein spaces between said features are termed gaps;

depositing a silicon dioxide liner layer overlying said features and lining said gaps while leaving said gaps open, wherein said depositing is by HDP CVD using a gas mixture comprising silane, oxygen, and argon, wherein said depositing is at a chamber pressure of less than 2 milliTorr, wherein said depositing comprises an etch to deposition ratio of between about 0.12 and about 0.15, wherein said depositing is performed at an argon partial pressure of between about 14% and 35%, and wherein a first sputter rf energy of between about 1600 watts and about 2200 watts is applied;

depositing a silicon dioxide gap filling layer overlying said silicon dioxide liner layer and filling said gaps, wherein said depositing is by HDP CVD using a gas mixture comprising silane, oxygen, and argon, wherein said depositing is at a chamber pressure of less than 2 milliTorr, wherein said depositing comprises an etch to deposition ratio of between about 0.15 and about 0.25, wherein said depositing is performed at an argon partial pressure of between about 14% and 35%, and wherein a second sputter rf energy of between about 2200 watts and 2800 watts is applied; and completing said integrated circuit device.

18. The method according to claim 17 wherein said step of depositing said silicon dioxide liner layer further comprises adding a dopant gas to said gas mixture wherein said dopant gas is a source of one of the group of:

fluorine, boron, phosphorous, boron, and arsenic.

19. The method according to claim 17 wherein said step of depositing said silicon dioxide gap filling layer further comprises adding a dopant gas to said gas mixture wherein said dopant gas is a source of one of the group of:

fluorine, boron, phosphorous, boron, and arsenic.

20. The method according to claim 17 wherein said gaps comprise one of the group of: spaces between metal lines, spaces between polysilicon lines, and shallow trenches in said semiconductor substrate.

* * * * *